(12) United States Patent
Hu et al.

(10) Patent No.: US 9,576,976 B1
(45) Date of Patent: Feb. 21, 2017

(54) THREE DIMENSIONAL MEMORY DEVICE

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/966,154

(22) Filed: Dec. 11, 2015

(51) Int. Cl.
| | |
|---|---|
| *G11C 11/40* | (2006.01) |
| *H01L 27/115* | (2006.01) |
| *H01L 23/528* | (2006.01) |
| *G11C 16/10* | (2006.01) |
| *G11C 16/14* | (2006.01) |
| *G11C 16/26* | (2006.01) |
| *G11C 16/04* | (2006.01) |

(52) U.S. Cl.
CPC ..... *H01L 27/11582* (2013.01); *G11C 16/0466* (2013.01); *G11C 16/0483* (2013.01); *G11C 16/10* (2013.01); *G11C 16/14* (2013.01); *G11C 16/26* (2013.01); *H01L 23/528* (2013.01)

(58) Field of Classification Search
CPC .................................................. G11C 11/56
USPC .................................................. 365/185.17
See application file for complete search history.

(56) References Cited

U.S. PATENT DOCUMENTS

| | | | | |
|---|---|---|---|---|
| 8,574,992 | B2 * | 11/2013 | Chen ............ | H01L 27/11206 257/314 |
| 8,969,944 | B2 | 3/2015 | Endoh et al. | |
| 9,419,010 | B2 | 8/2016 | Shih et al. | |
| 2010/0195395 | A1* | 8/2010 | Jeong .............. | G11C 16/0483 365/185.17 |
| 2010/0265773 | A1* | 10/2010 | Lung ............... | G11C 16/0458 365/185.27 |
| 2011/0199804 | A1* | 8/2011 | Son ................. | G11C 5/04 365/51 |
| 2012/0300547 | A1* | 11/2012 | Choi ............... | H01L 27/11565 365/185.05 |

(Continued)

FOREIGN PATENT DOCUMENTS

| | | |
|---|---|---|
| CN | 104867930 A | 8/2015 |
| TW | 201203523 A | 1/2012 |

OTHER PUBLICATIONS

TIPO Office Action dated Oct. 3, 2016 in Taiwan application (No. 104142185).

*Primary Examiner* — Min Huang
(74) *Attorney, Agent, or Firm* — McClure, Qualey & Rodack, LLP

(57) ABSTRACT

A 3D memory device includes a multi-layer stacks structure having a plurality of conductive strips and a first, a second, a third and a fourth ridge stack; a first SSL switch, a first GSL switch, a second SSL switch and a second GSL switch respectively disposed on the first, the second the third and the fourth ridge stack; a first U-shaped memory cells string connecting the first SSL switch with the first GSL switch; a second U-shaped memory cells string connecting the second SSL switch with the second GSL switch; a first word lines contact in contact with the conductive strips disposed in the first ridge stack; a second word lines contact in contact with the conductive strips disposed in the second ridge stack; and a third word lines contact in contact with the conductive strips disposed in the third ridge stack and the fourth ridge stack.

13 Claims, 9 Drawing Sheets

(56) References Cited

U.S. PATENT DOCUMENTS

| | | | |
|---|---|---|---|
| 2013/0094273 A1* | 4/2013 | Chien | G11C 5/06 365/63 |
| 2013/0264631 A1* | 10/2013 | Alsmeier | H01L 21/28282 257/324 |
| 2015/0085579 A1* | 3/2015 | Chen | H01L 27/1157 365/185.17 |
| 2016/0071876 A1* | 3/2016 | Mizuno | H01L 21/28282 365/185.17 |

* cited by examiner

THREE DIMENSIONAL MEMORY DEVICE

BACKGROUND

Technical Field

The disclosure in generally relates to a memory device, and more particularly to a three dimensional (3D) memory device.

Description of the Related Art

Non-volatile memory (NVM) which is able to continually store information even when the supply of electricity is removed from the device containing the NVM cell has been widely adopted by bulk solid state memory applications in portable audiovisual entertainment devices, cell phones or digital cameras etc. Recently, various three dimensional (3D) memory devices, such as a 3D flash memory device having a single gate, a double gate or a surrounding gate, has been provided in order to accommodate the rising demand for superior memory.

A typical 3D memory device includes a 3D memory cell array having vertical channels formed in a multi-layer stacks. To take a single-gate vertical channel (SGVC) NAND device for example, a plurality of stacked poly-silicon conductive stripes are applied to serve as the gates of the memory cell involved in the 3D memory cell array. The poly-silicon conductive stripes should be divided to several portions for connecting to a plurality of metal word lines disposed on the cell memory array through a plurality of staircase-shaped word lines contacts.

However, the word lines contacts occupy the areas of the SGVC NAND device, and the space over the memory cell array for arranging the word lines is rather limited to allow additional word lines passing there through. As the memory density of the SGVC NAND device is increased, the levels of the conductive strips can also be increased, and more word lines contacts and word lines are required for the added levels of the conductive strips. Currently, there are two ways to solve these problems. One is to increase the physical size of the SGVC NAND device, the other is to shrink the pitch of the word line for allowing the added word lines contacts and word lines arranged therein.

But, the process window and the yield for fabrication the SGVC NAND device may be decreased, and oxide break-down may occur due to the shrunk pitch of the word lines. The production cost thereof may be thus increased. In contrast, increasing the physical size of the SGVC NAND device does not meet the current trend of being lightweight and compact in memory device.

Therefore, there is a need of providing an improved 3D memory device to obviate the drawbacks encountered from the prior art.

SUMMARY

One aspect of the present disclosure is to provide a 3D memory device, wherein the 3D memory device includes a multi-layer stacks structure, a first string select line (SSL) switch, a first ground select line (GSL) switch, a second SSL switch, a second GSL switch, a first U-shaped memory cells string, a second U-shaped memory cells string, a first word lines contact, a second word lines contact and a third word lines contact. The multi-layer stacks structure includes a plurality of conductive strips insulated with each other and a plurality of trenches used to at least divide the multi-layer stacks structure into a first ridge stack, a second ridge stack, a third ridge stack and a fourth ridge stack. The first SSL switch is disposed on the first ridge stack. The first GSL switch is disposed on the second ridge stack. The first U-shaped memory cells string connects the first SSL switch with the first GSL switch in series. The second SSL switch is disposed on the third ridge stack. The second GSL switch is disposed on the fourth ridge stack. The second U-shaped memory cells string connects the second SSL switch with the second GSL switch in series. The first word lines contact is in contact with a portion of the conductive strips disposed in the first ridge stack. The second word lines contact is in contact with a portion of the conductive strips disposed in the second ridge stack. The third word lines contact is in contact with a portion of the conductive strips disposed in the third ridge stack and the fourth ridge stack.

In accordance with the aforementioned embodiments of the present disclosure, a 3D memory device having a plurality of ridge stacks is provided, wherein each of the ridge stacks either includes a SSL switch and a plurality of memory cells beneath the SSL switch or includes a GSL switch and a plurality of memory cells beneath the GSL switch. A first U-shaped memory cells string is formed by connecting a first SSL switch and a first GSL switch respectively disposed on two different ridge stacks, as well as the memory cells beneath the first SSL switch and the first GSL switch in series; and a second U-shaped memory cells string is formed by connecting a second SSL switch and a second GSL switch respectively disposed on another two ridge stacks, as well as the memory cells disposed beneath the second SSL and the second GSL switch.

The memory cells that are disposed beneath the first SSL switch in the first U-shaped memory cells string are connected to a first word lines contact; the memory cells that are disposed beneath the second SSL switch in the second U-shaped memory cells string are connected to a second word lines contact; and the memory cells that are disposed beneath the first GSL switch in the first U-shaped memory cells string and the second GSL switch in the second U-shaped memory cells are both connected to a third word lines contact. In other words, the number of the word lines contacts that is used to connect to the memory cells beneath the GSL switches is less than the number of the word lines contacts connected to the memory cells beneath the SSL switches. In comparison with the prior art 3D memory device, the total number of the word lines contacts can be reduced, if the memory densities thereof are not varied.

Therefore, the size of the 3D memory device can be reduced by reducing the number of the word lines contacts. In addition, the memory densities can be increased without deteriorate the process window and the yield for fabricating the 3D memory device. As well the production cost thereof can be reduced significantly.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
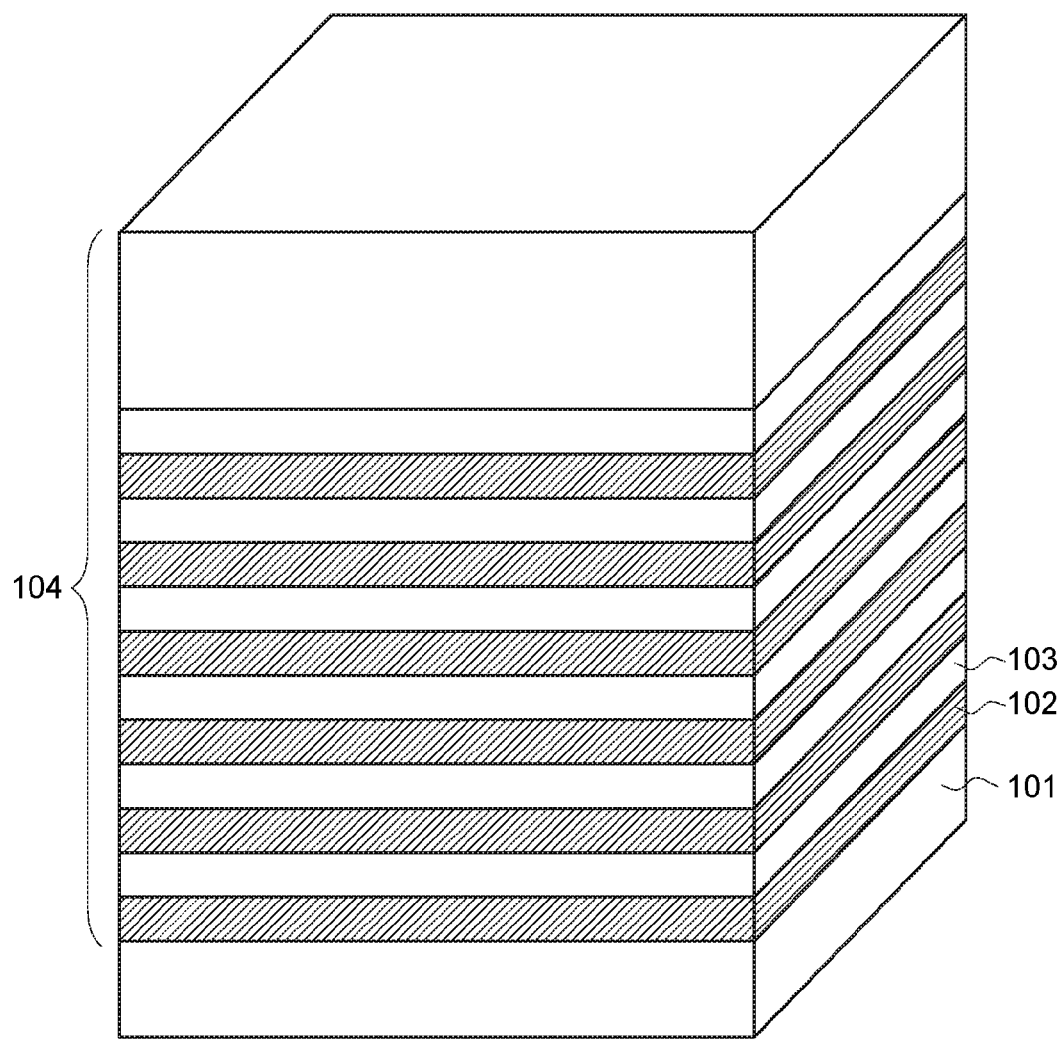
FIGS. 1A to 1D are perspective views illustrating partial structures at different intermediate steps for forming a SGVC NAND device in accordance with one embodiment of the present disclosure.
Figure 1B:
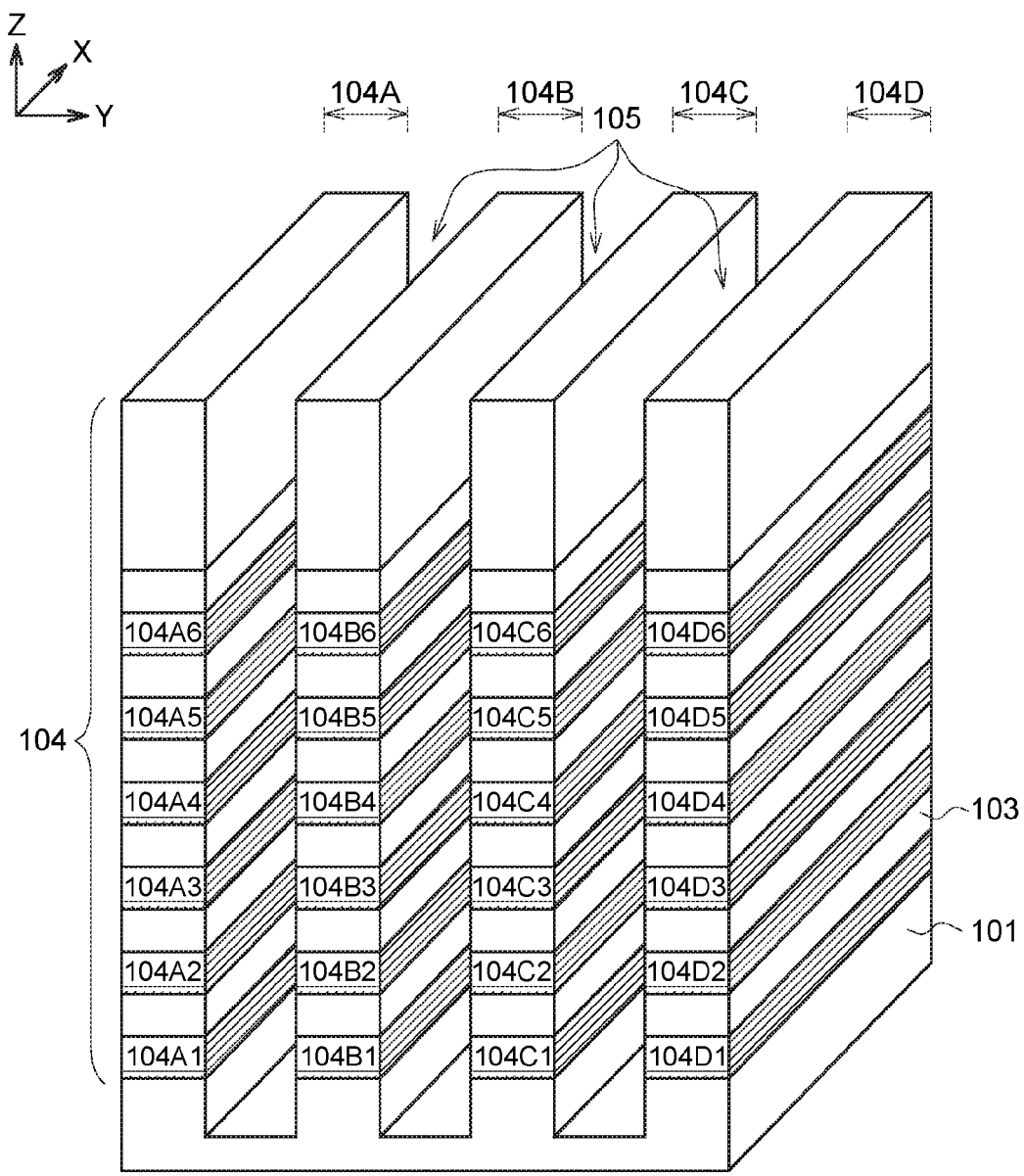

The embodiments as illustrated below provide a 3D memory device to solve the problems of poor process windows due to the increased memory density and to improve the yield, as well as the production cost thereof. The present disclosure will now be described more specifically with reference to the following embodiments illustrating the structure and method for fabricating the 3D memory device.

It is to be noted that the following descriptions of preferred embodiments of this disclosure are presented herein for the purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

FIGS. 1A to 1D are perspective views illustrating partial structures at different intermediate steps for forming a SGVC NAND device 100 in accordance with one embodiment of the present disclosure. The method for fabricating the SGVC NAND device 100 includes steps as follows: A multi-layer stack structure 104 is firstly provided on a substrate 101 (see FIG. 1A). In the present embodiment, the multi-layer stack structure 104 includes a plurality of conductive material layers 102 and a plurality of insulating layers 103 alternatively stacked with each other on the substrate 101 along a Z direction depicted in FIG. 1A.

In some embodiments of the present disclosure, the conductive material layers 102 may be made of n type poly-silicon (single crystal epitaxial silicon) doped with n type dopants (e.g. phosphorus or arsenic), p type poly-silicon (single crystal epitaxial silicon) doped with p type dopants (e.g. boron), undoped poly-silicon, silicide, such as titanium-silicon (TiSi), cobalt-silicon (CoSi) or silicon germanium (SiGe), oxide semiconductors, such as, Indium zinc oxide (InZnO) or indium-gallium-zinc-oxide (InGaZnO), metal, such as aluminum (Al), copper (Cu), tungsten (W), titanium (Ti), cobalt (Co), nickel (Ni), titanium nitride (TiN), tantalum nitride (TaN), or tantalum aluminum nitride (TaAlN), or a combination of two or more of these materials. The insulating layers 103 may be formed by silicon oxide, silicon nitride, silicon oxynitride, silicate, a combination of two or more of these materials, or other suitable dielectric material.

Next, an etching process is performed to form a plurality of ridge stacks, such as the ridge stacks 104A, 104B, 104C and 104D. In some embodiments of the present disclosure, an anisotropic etching process, such as a reactive ion etching (RIE) process is performed on the multi-layer stack structure 104 to form a plurality of trenches 105 in the multi-layer stack structure 104 laterally extending along an X direction and vertically extending along the Z direction, so as to divide the multi-layer stack structure 104 into four ridge stacks 104A, 104B, 104C and 104D, and to expose a portion of the substrate 101 from the trenches 105 (see FIG. 1B).

Each of the ridge stacks 104A, 104B, 104C and 104D includes a plurality of conductive strips. For example, in the present embodiment, the ridge stack 104A includes conductive strips 104A1, 104A2, 104A3, 104A4, 104A5 and 104A6 stacked upwards along the Z direction; the ridge stack 104B includes conductive strips 104B1, 104B2, 104B3, 104B4, 104B5 and 104B6 stacked upwards along the Z direction; the ridge stack 104C includes conductive strips 104C1, 104C2, 104C3, 104C4, 104C5 and 104C6 stacked upwards along the Z direction; and the ridge stack 104D includes conductive strips 104D1, 104D2, 104D3, 104D4, 104D5 and 104D6 stacked upwards along the Z direction. Wherein the conductive strips 104A1, 104B1, 104C1 and 104D1 that are respectively disposed on the top level of the ridge stacks 104A, 104B, 104C and 104D each may have a thickness substantially greater than that of the other conductor strips 104A1-104A5, 104B1-104B5, 104C1-104C5 and 104D1-104D5 involve in the ridge stacks 104A, 104B, 104C and 104D.

Thereafter, a memory material layer 106 having a charge trapping structure is formed to cover sidewalls of the ridge stacks 104A, 104B, 104C and 104D and the bottom of the trenches 105. A patterned semiconductor channel layer 107 is then formed on the memory material layer 106, so as to form a plurality of memory cells 108 at the cross points of the memory material layer 106, the patterned semiconductor channel layer 107 and the conductor strips 104A1-104A6, 104B1-104B6, 104C1-104C6 and 104D1-104D6 involve in the ridge stacks 104A, 104B, 104C and 104D (see FIG. 10).

In some embodiment of the present disclosure, the charge trapping structure may be a stack of composite layers which is selected from a group consisting of oxide-nitride-oxide (ONO), oxide-nitride-oxide-nitride-oxide (ONONO), silicon-oxide-nitride-oxide-silicon (SONOS), band gap engineered silicon-oxide-nitride-oxide-silicon (BE-SONOS), tantalum nitride, aluminum oxide, silicon nitride, silicon oxide, silicon (TANOS) and metal-high-k band gap-engineered silicon-oxide-nitride-oxide-silicon (MA BE-SONOS). The patterned semiconductor channel layer 107 can be made of n type poly-silicon or n type single crystal epitaxial silicon doped with n type dopants (e.g. phosphorus or arsenic) or can be made of p type poly-silicon or single crystal epitaxial silicon doped with p type dopants (e.g. boron).

In the present embodiment, the patterned semiconductor channel layer 107 is an n type poly-silicon layer including at least two portions separated with each other. One portion of the patterned semiconductor channel layer 107 covers on the sidewalls of the ridge stacks 104A and 104B as well as the bottom of the trench 105 used to separate the ridge stacks 104A and 104B and serves as a channel film connecting the memory cells formed on the sidewalls of the ridge stacks 104A and 104B in series, so as to form a first U-shaped memory cells string 109A. The other portion of the patterned semiconductor channel layer 107 covers on the sidewalls of the ridge stacks 104C and 104C as well as the bottom of the trench 105 used to separate the ridge stacks 104C and 104D and serves as a channel film connecting the memory cells formed on the sidewalls of the ridge stacks 104C and 104D in series, so as to form a second U-shaped memory cells string 109B.

Wherein, the top memory cell formed on the ridge stacks 104A can serve as a first GSL switch 110A of the first U-shaped memory cells string 109A; and the top memory cell formed on the ridge stacks 104B can serve as a first SSL switch 111A of the first U-shaped memory cells string 109A. The top memory cell formed on the ridge stacks 104C can serve as a second GSL switch 110B of the first U-shaped memory cells string 109A; and the top memory cell formed on the ridge stacks 104D can serve as a second SSL switch 111B of the second U-shaped memory cells string 109B.

Figure 1C:
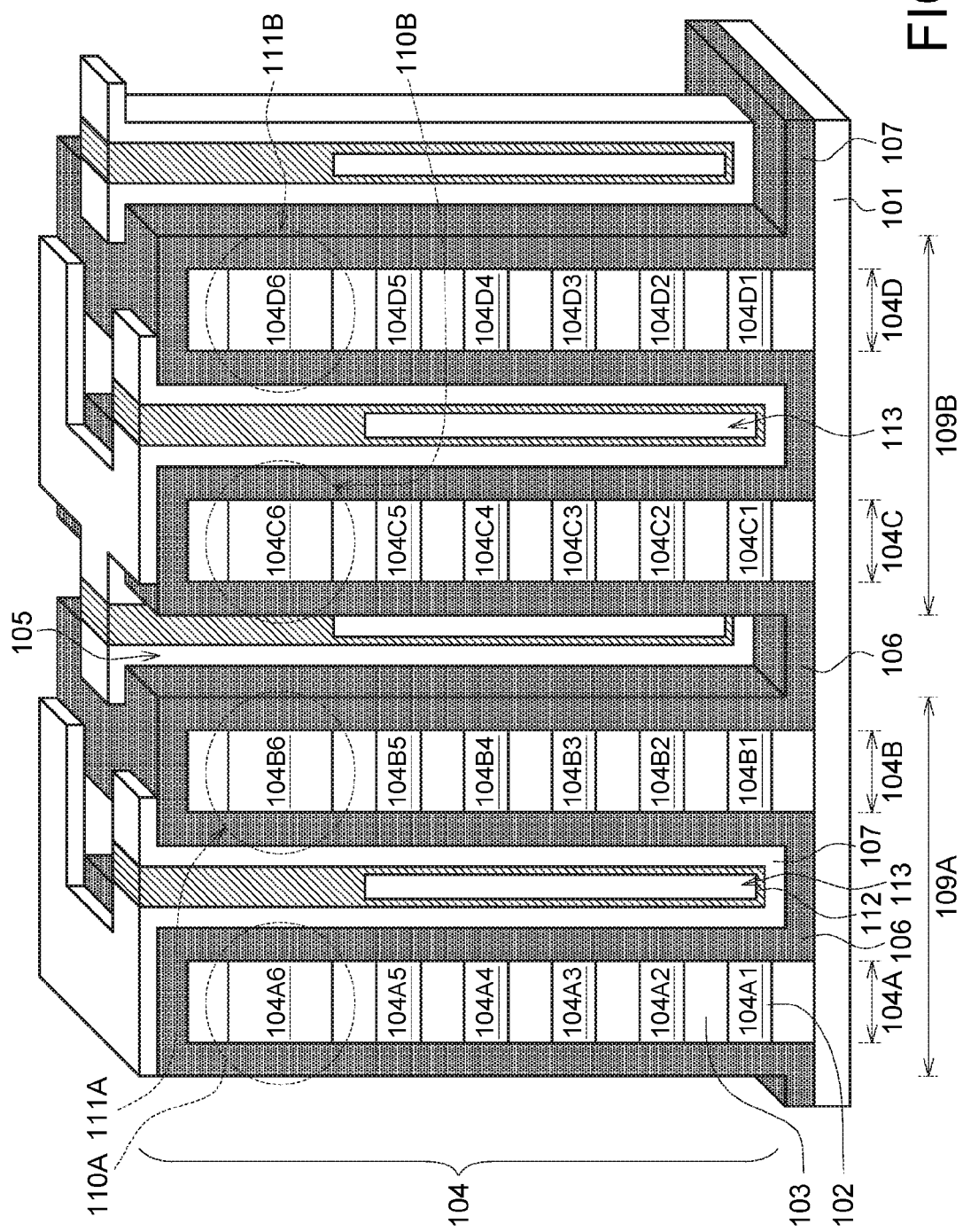

It should be appreciated that the structure depicted in FIG. 1C is just illustrative, but not intended to limit the scope of the preset disclosure; nevertheless merely two U-shaped memory cells strings (i.e. the first U-shaped memory cells string 109A and the second U-shaped memory cells string 109B) formed on four ridge stacks (i.e. the ridge stacks 104A, 104B, 104C and 104D) are shown therein. In some embodiments of the present disclosure, the SGVC NAND device 100 can include more U-shaped memory cells strings and more the ridge stacks, thereby a 3D memory cells array can be formed in the SGVC NAND device 100.

After the first U-shaped memory cells string 109A and the second U-shaped memory cells string 109B are formed, a dielectric material 112 is filled into the trenches 105. In some embodiments of the present invention, the dielectric material 112 may be made of silicon oxide, silicon nitride, silicon oxynitride, high dielectric constant (high-k) materials or the arbitrary combinations thereof. In the present embodiment, air gaps 113 are preferably formed in the trenches 105 when the dielectric material 112 is filled in the trenches 105 used to reduce the inter-cell interference caused between the memory cells 108 that are formed on different ridge stacks (e.g. the ridge stacks 104A, 104B, 104C and 104D).

Figure 1D:
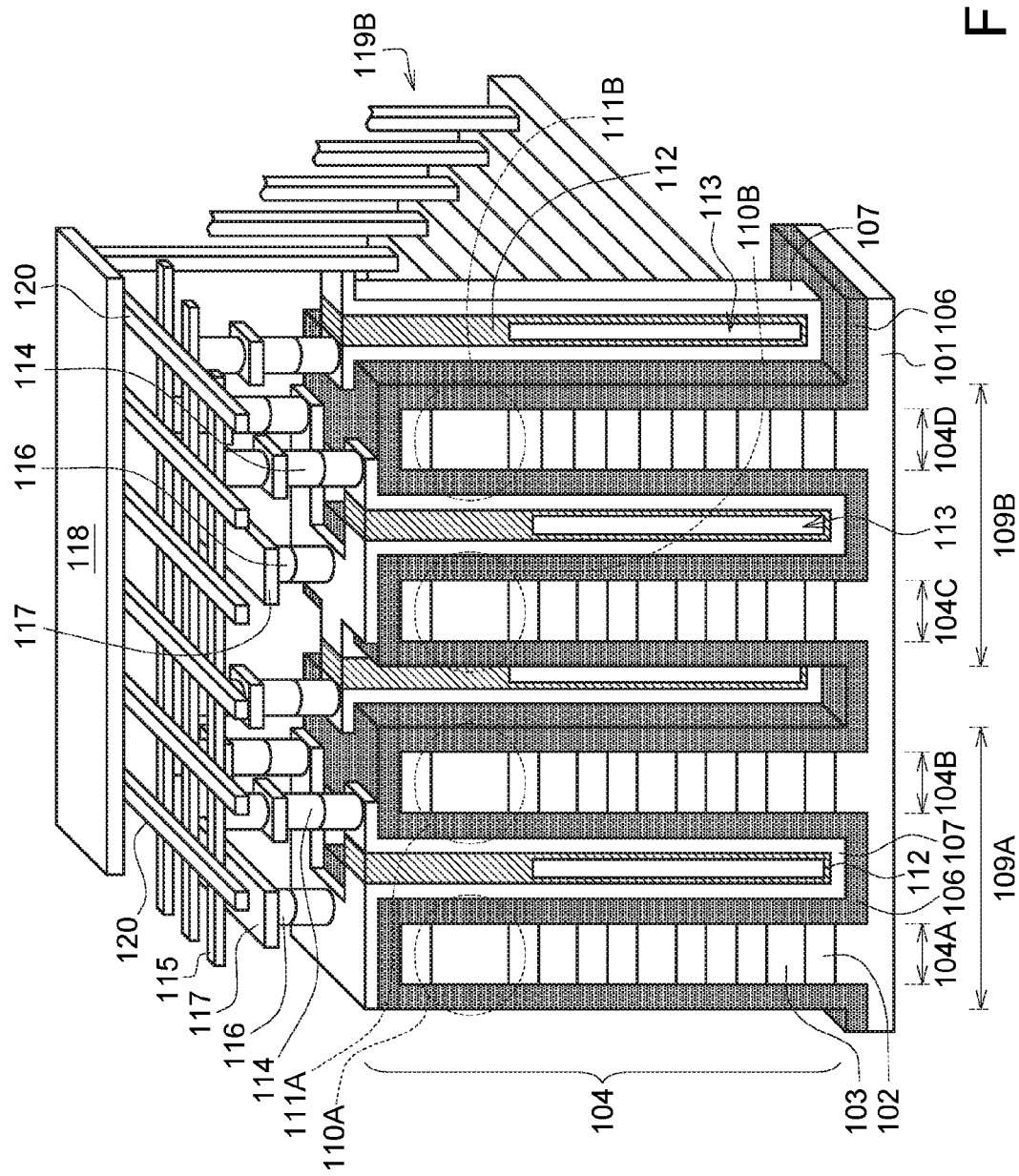

Subsequently, a plurality of contact plugs 114 are formed to respectively connect the first SSL switch 111A and the second SSL switch 111B of the first U-shaped memory cells string 109A and the second U-shaped memory cells string 109B to a bit line 115; a plurality of contact plugs 116 are formed to respectively connect the first GSL switch 110A and the second GSL switch 110B of the first U-shaped memory cells string 109A and the second U-shaped memory cells string 109B to a common source line 118 through metal wires 117. A plurality of word lines contacts (e.g. the word lines contact 119B as shown in FIG. 1D) are formed on a peripheral area of the cell memory array to make the conductive strips 104A1-104A6, 104B1-104B6, 104C1-104C6 and 104D1-104D6 involve in the same levels of the ridge stacks 104A, 104B, 104C and 104D in contact with different word lines 120 respectively.

Figure 2:
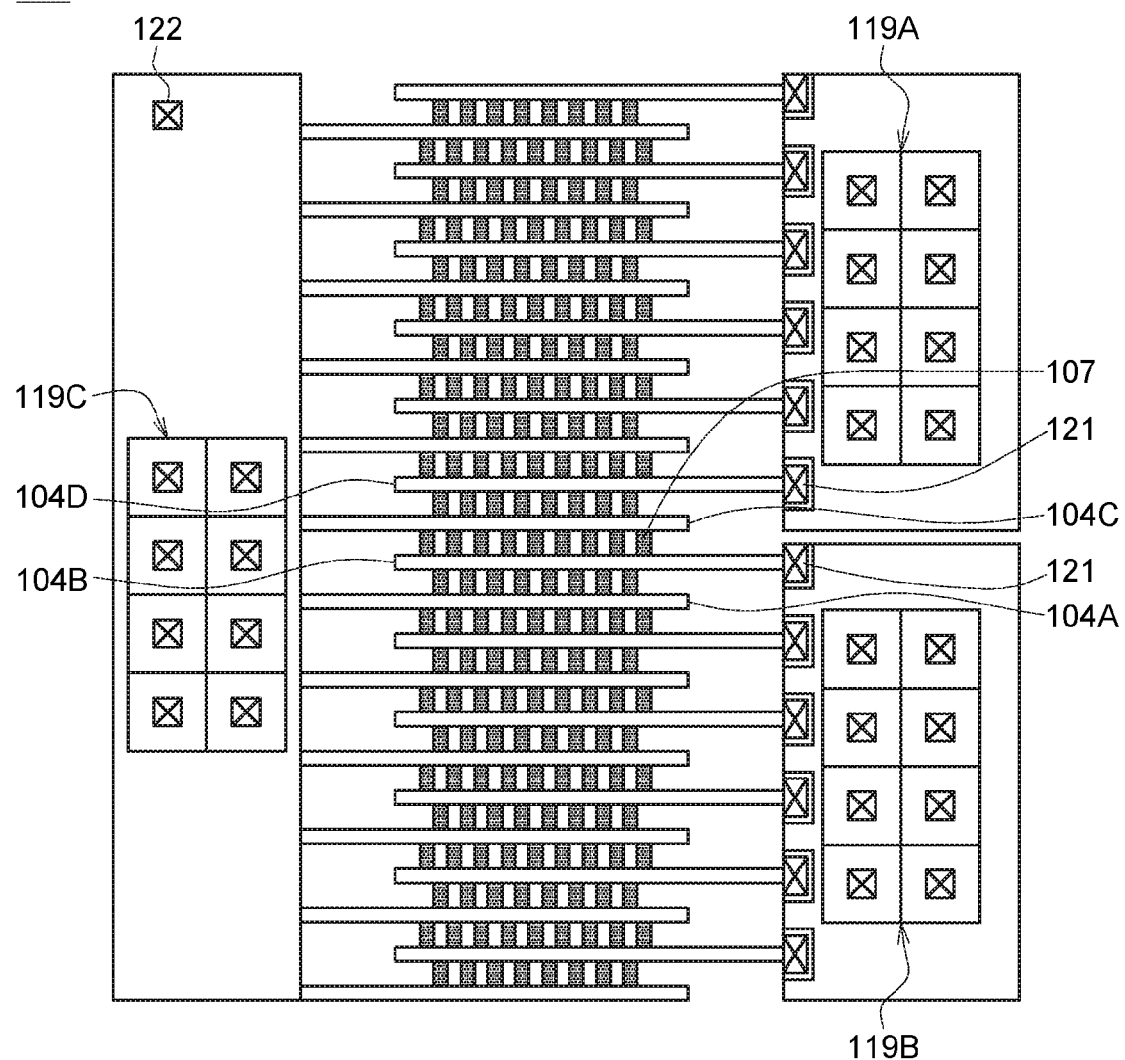
FIG. 2 is a top view illustrating the partial structure of the SGVC NAND device depicted in FIG. 1D.

The detailed arrangement of the word lines contacts, such as the word lines contacts 119A, 119B and 119C can be described in FIG. 2. FIG. 2 is a top view illustrating the partial structure of the SGVC NAND device 100 depicted in FIG. 1D. The word lines contacts 119A, 119B and 119C are arranged to adjacent to the two ends of the long axis of the ridge stacks 104A, 104B, 104C and 104D respectively. In the present embodiment, the word lines contact 119A has a staircase-shaped structure including a plurality of contacting layers respectively in contact with the conductive strips that are disposed on different levels of the ridge stack 104B; the word lines contact 119B has a staircase-shaped structure including a plurality of contacting layers respectively in contact with the conductive strips that are disposed on different levels of the ridge stack 104D; and the word lines contact 119C has a staircase-shaped structure including a plurality of contacting layers respectively in contact with the conductive strips that are disposed on identical levels of the ridge stacks 104A and 104C.

In other words, the conductive strips that are disposed on the same levels of the ridge stacks 104A and 104C may share the same word lines contact 119C. In details, the conductive strips 104A1 and the 104C1 that are disposed on the first level of the ridge stacks 104A and 104C is in contact with a first contacting layers (not shown) of the staircase-shaped structure involved in the word lines contact 119C; the conductive strips 104A2 and the 104C2 that are disposed on the second level of the ridge stacks 104A and 104C is in contact with a second contacting layer (not shown) of the staircase-shaped structure involved in the word lines contact 119C; the conductive strips 104A3 and the 104C3 that are disposed on the third level of the ridge stacks 104A and 104C is in contact with a third contacting layer (not shown) of the staircase-shaped structure involved in the word lines contact 119C; the conductive strips 104A4 and the 104C4 that are disposed on the fourth level of the ridge stacks 104A and 104C is in contact with a fourth contacting layer (not shown) of the staircase-shaped structure involved in the word lines contact 119C; the conductive strips 104A5 and the 104C5 that are disposed on the fifth level of the ridge stacks 104A and 104C is in contact with a fifth contacting layer (not shown) of the staircase-shaped structure involved in the word lines contact 119C; and the conductive strips 104A6 and the 104C6 that are disposed on the sixth level of the ridge stacks 104A and 104C is in contact with a sixth contacting layer (not shown) of the staircase-shaped structure involved in the word lines contact 119C. Since the word lines contact is well known by the skilled in the art, thus the structure and detailed process for forming the same will not be redundantly described.

However, the arrangement of the word lines contacts is not limited to this regards. In some embodiments of the present invention, the conductive strips that are disposed beneath different SSL switches involved in more than two U-shaped memory cells strings are respectively in contact with different word lines contacts; and the conductive strips that are disposed beneath different GSL switches involved in more than two U-shaped memory cells strings may share an identical word lines contact.

In some embodiments of the present invention, the SGVC NAND device 100 further includes a plurality of SSL pads 121 and a common GSL pad 122 used to connect the SSL switches (e.g. the first SSL switch 111A and the second SSL switch 111B) and the GSL switches (e.g. the first GSL switch 110A and the second GSL switch 110B) to a decoder (not shown) respectively. For example, in the present embodiment, the SSL pads 121 are disposed on one end of the ridge stacks 104B and 104D on which the first SSL switch 111A and the second SSL switch 111B is formed adjacent to the word lines contacts 119A and 119B, and are in contact with one of the conductive strips 104B6 and 104D6 which constitute the first SSL switch 111A and the second SSL switch 111B, respectively. The common GSL pad 122 is disposed on the other ends of the ridge stacks 104A and 104C on which the first GSL switch 110A and the second GSL switch 110B are formed adjacent to the word lines contact 119C, and is in contact with the conductive strips 104A6 and 104C6 which constitute the first GSL switch 110A and the second GSL switch 110B, respectively.

Figure 3:
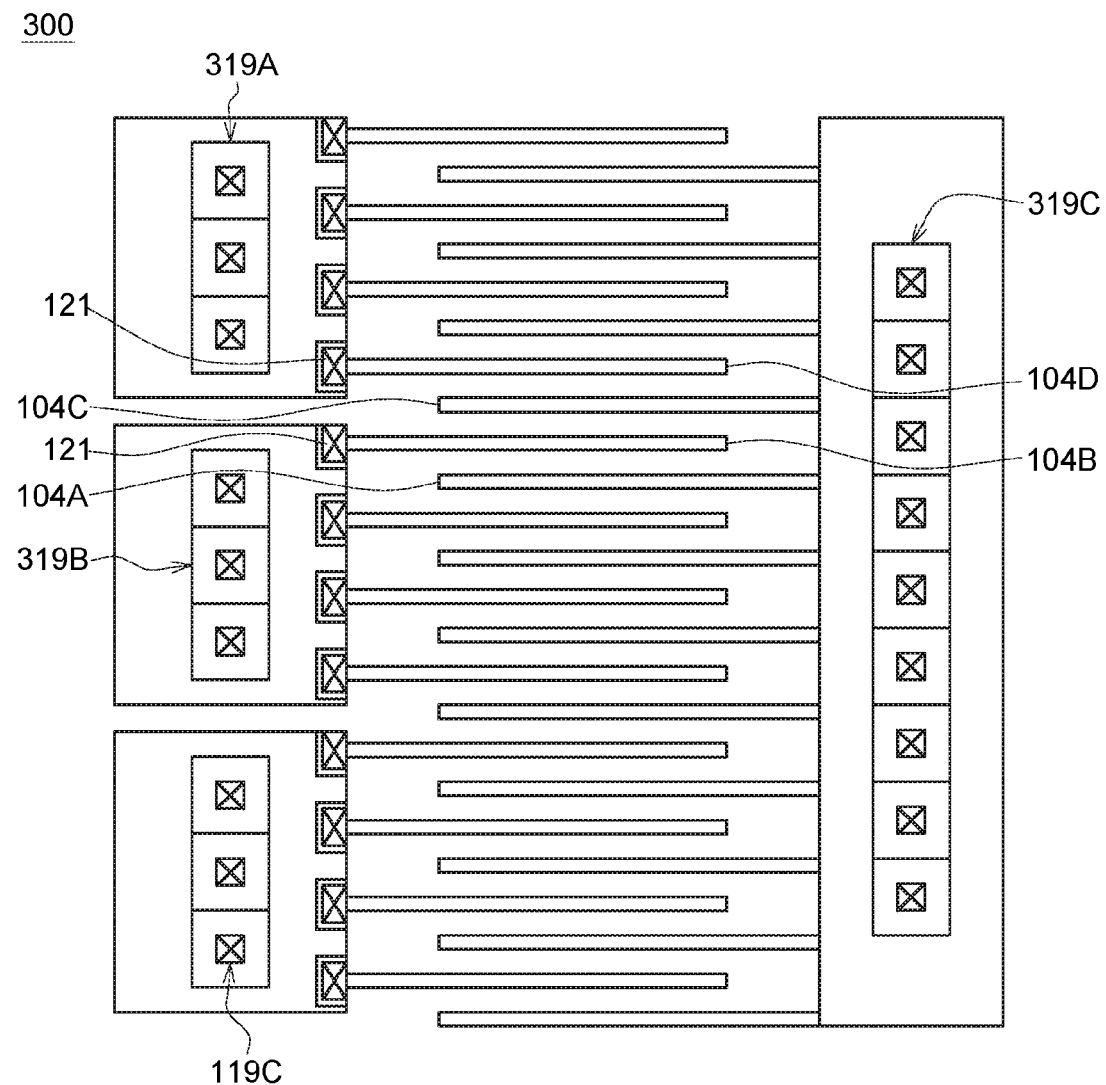
FIG. 3 is a top view illustrating the partial structure of a SGVC NAND device in accordance with another embodiment of the present disclosure.

The shape of the word lines contact shared by the conductive strips that are disposed in different ridge stacks and beneath different GSL switches may have different shapes, in accordance with various design of the SGVC NAND device. FIG. 3 is a top view illustrating the partial structure of a SGVC NAND device 300 in accordance with another embodiment of the present disclosure. The structure of the SGVC NAND device 300 is similar to that of the SGVC NAND device 100 except the shape of the of the word lines contact 319C disposed adjacent to the common GSL pad 122. In the present embodiment, the word lines contact 319C shared by the conductive strips 104A6 and 104C6 that are disposed in the ridge stacks 104A and 104C and beneath the first GSL switch 110A and the second GSL switch 110B may be shaped as a long staircase. As a result, the lateral size of the SGVC NAND device 300 can be reduced.

In order to avoid signal interference occurring in different U-shaped memory cells strings 109A and 109B having conductive strips sharing the same word lines contact 119C during the program operation, the read operation and the erase operation, the SGVC NAND device 100 may further include a first control switch IG_1A disposed in the first U-shaped memory cells strings 109A between the first SSL switch 111A and the first GSL switch 110A and a second control switch IG_1B disposed in the second U-shaped memory cells strings 109B between the second SSL switch 111B and the second GSL switch 110B.

Figure 4:
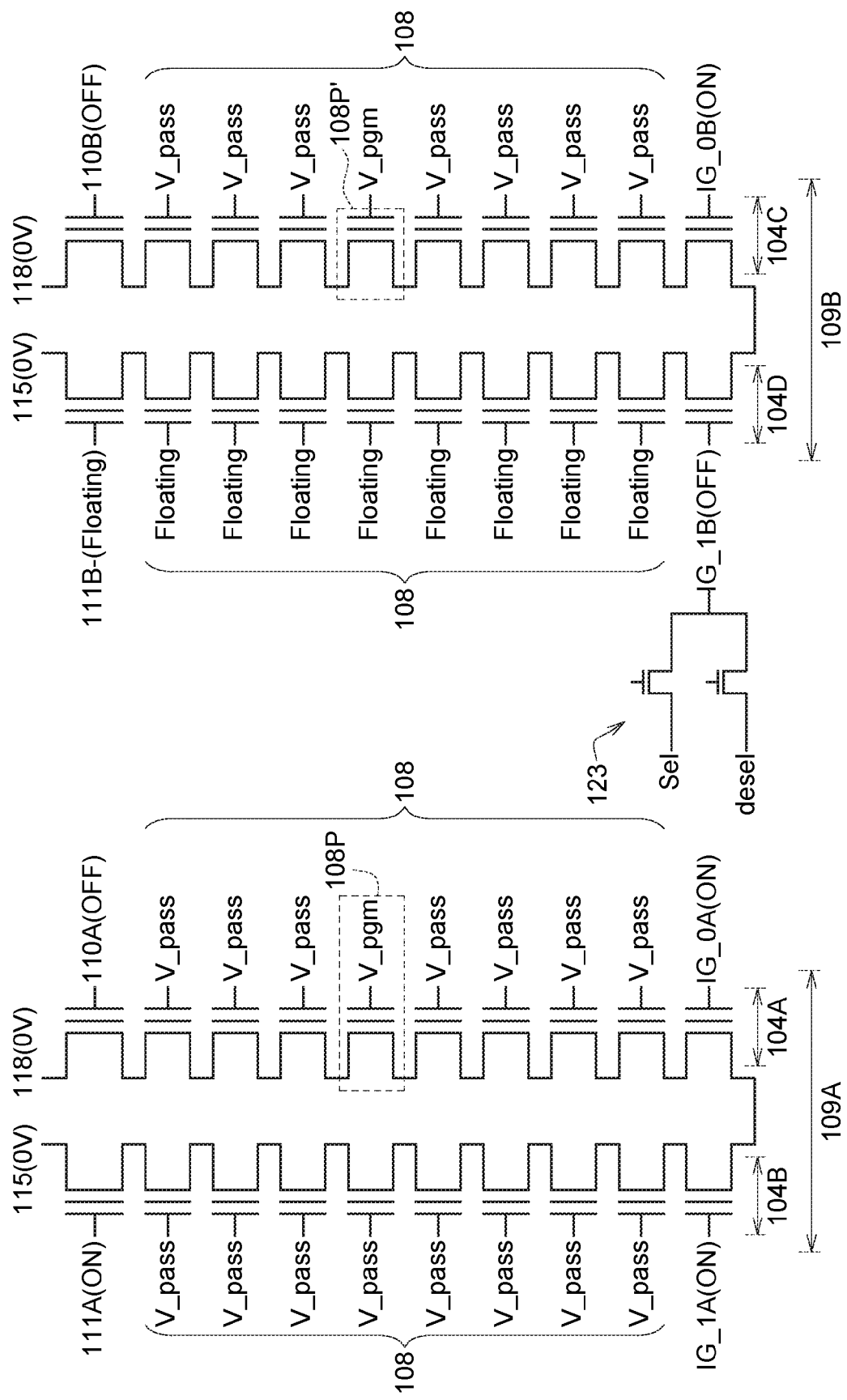
FIG. 4 is a diagram illustrating an equivalent circuit of the SGVC NAND device depicted in FIG. 1D as a program operation is performed thereon.

FIG. 4 is a diagram illustrating an equivalent circuit of the SGVC NAND device 100 depicted in FIG. 1D as a program operation is performed thereon. In the present embodiment, the first control switch IG_1A may include a complementary switch circuit 123 connected to the bottom conductive strip 104B1 of the ridge stack 104B used to control the ON/OFF of the memory cell 108 formed by the bottom conductive strip 104B1. The second control switch IG_1B is connected to the bottom conductive strip 104D1 of the ridge stack 104D used to control the ON/OFF of the memory cell 108 formed by the bottom conductive strip 104D1. Since the structure of the second control switch IG_1B can be identical to that of the first control switch IG_1A, thus the detail circuit will not be redundantly depicted in FIG. 4. However, in some the structure of the second control switch IG_1B can be different from that of the first control switch IG_1A.

In other embodiments, the SGVC NAND device 100 further includes a first assist control switch IG_0A formed between the first control switch IG_1A and the first GSL switch 110A and a second assist control switch IG_0B formed between the second control switch IG_1B and the first GSL switch 110A. Similarly, the structure of the first assist control switch IG_0A and the second assist control switch IG_0B can be identical to or different from that of the first control switch IG_1A.

In the present embodiment, the first assist control switch IG_0A is connected to the bottom conductive strip 104A1 of the ridge stack 104A used to control the ON/OFF of the memory cell 108 formed by the bottom conductive strip 104A1. The second assist control switch IG_0B connects to the bottom conductive strip 104C1 of the ridge stack 104C used to control the ON/OFF of the memory cell 108 formed by the bottom conductive strip 104C1.

When a memory cell 108P formed in the first U-shaped memory cells strings 109A is selected by the first SSL switch 111A to be subject to a program operation, the first SSL switch 111A, the first control switch IG_1A and the first assist control switch IG_0A may be turn on; the first GSL switch 110A is turn off; a voltage of 0 V is then applied to the first SSL switch 111A and the first GSL switch 110A through the bit line 115 and the common source line 118; a program voltage Vpgm is applied to the gate of the selected memory cell 108P through one of the word line 120; and the other memory cell 108 formed in the first U-shaped memory cells strings 109A are subject to a pass-gate voltage Vpass. Wherein the program voltage Vpgm is greater than the pass-gate voltage Vpass. As a result, Fowler-Nordheim tunneling of electrons are induced in the selected memory cell 108P and program data is store in the selected memory cell 108P.

Meanwhile, floating voltages are applied to the second SSL switch 111B formed on the ridge stack 104B and the memory cells 108 beneath the second SSL switch 111B in the unselected second U-shaped memory cells strings 109B. Since the conductive strips disposed in the ridge stacks 104A and 104C share the same word lines contact 110C and the first GSL switch 110A and the second GSL switch 110B share the common GSL pad 122, thus the gate voltages applied on the second GSL switch 110B and the memory cells 108 (including the unselected memory cell 108P') beneath the second GSL switch 110B can be identical to that applied on the first GSL switch 110A and the memory cells 108 (including the selected memory cell 108P) beneath the first GSL switch 110A. When the second control switch IG_1B is turn off during the program operation, the captaincy of the unselected second U-shaped memory cells strings 104C in U-shaped memory cells strings 109B can form a local self-boosting to be remained on a predetermined level and avoid the unselected memory cell 108P' being programmed by the program voltage Vpgm.

Figure 5:
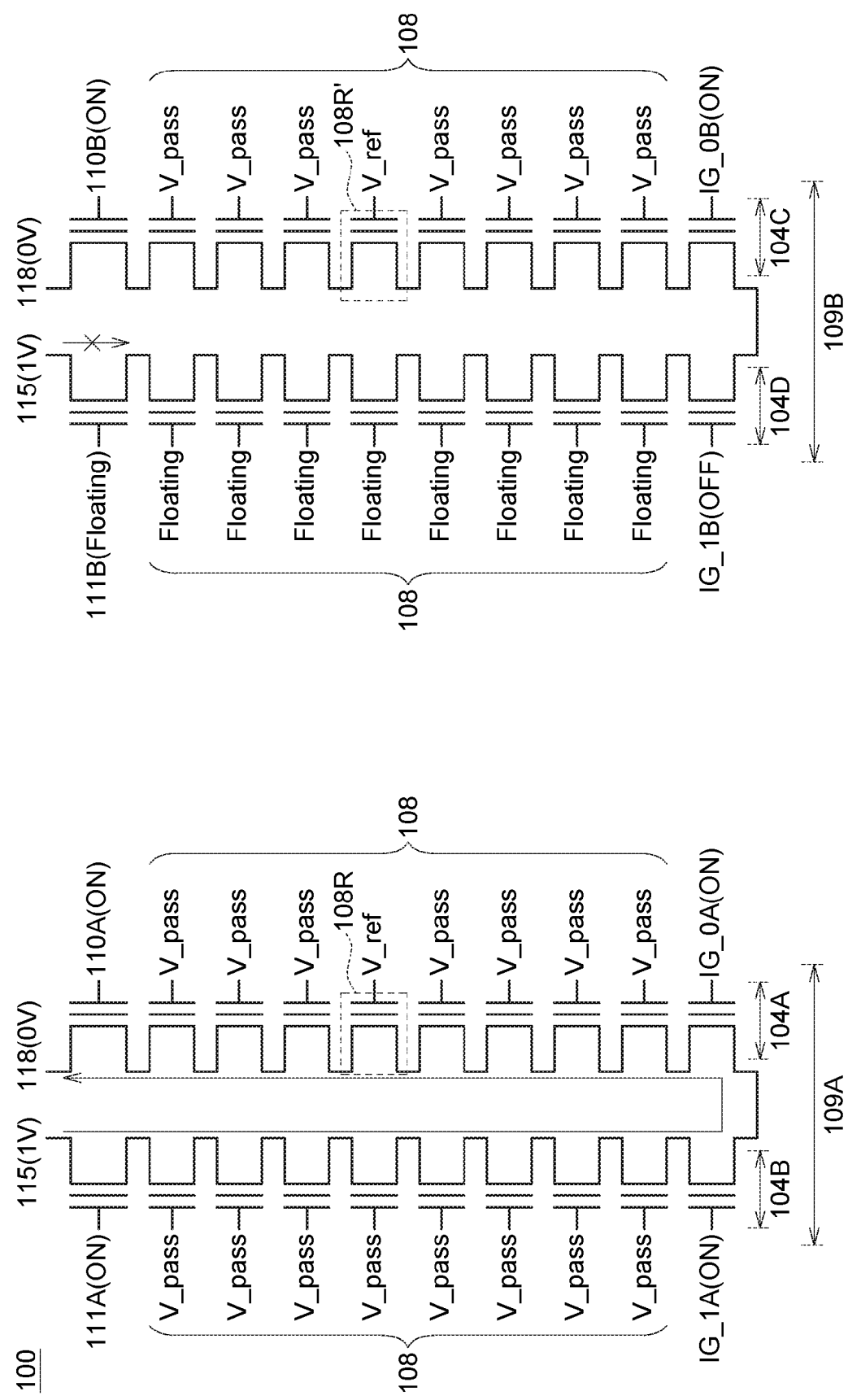
FIG. 5 is a diagram illustrating an equivalent circuit of the SGVC NAND device depicted in FIG. 1D as a read operation is performed thereon.

FIG. 5 is a diagram illustrating an equivalent circuit of the SGVC NAND device 100 depicted in FIG. 1D as a read operation is performed thereon. When a memory cell 108R formed in the first U-shaped memory cells strings 109A is selected by the first SSL switch 111A to be subject to a read operation, the first SSL switch 111A, the first GSL switch 110A, the first control switch IG_1A and the first assist control switch IG_0A may be turn on; a voltage of 0 V are then applied to the first GSL switch 110A through a common source line 118 and a floating voltage is applied to the gate of the first GSL switch 110A; a read voltage Vref is applied to the gate of the selected memory cell 108R through one of the word line 120; and the other memory cell 108 formed in the first U-shaped memory cells strings 109A are subject to a pass-gate voltage Vpass. As a result, the data stored in the selected memory cell 108R can be read out.

Meanwhile, floating voltages are applied to the gates of the second SSL switch 111B formed on the ridge stack 104B and the memory cells 108 beneath the second SSL switch 111B in the unselected second U-shaped memory cells strings 109B. Since the conductive strips disposed in the ridge stacks 104A and 104C share the same word lines contact 110C and the first GSL switch 110A and the second GSL switch 110B share the common GSL pad 122, thus the gate voltages applied on the second GSL switch 110B and the memory cells 108 (including the unselected memory cell 108P') beneath the second GSL switch 110B can be identical to that applied on the first GSL switch 110A and the memory cells 108 (including the selected memory cell 108P) beneath the first GSL switch 110A. When the second control switch IG_1B is turn off during the program operation, the floated second SSL switch 111B and the memory cells 108 beneath the second SSL switch 111B in the unselected second U-shaped memory cells strings 109B can avoid the unselected memory cell 108R' being read out by the read voltage Vref.

Figure 6:
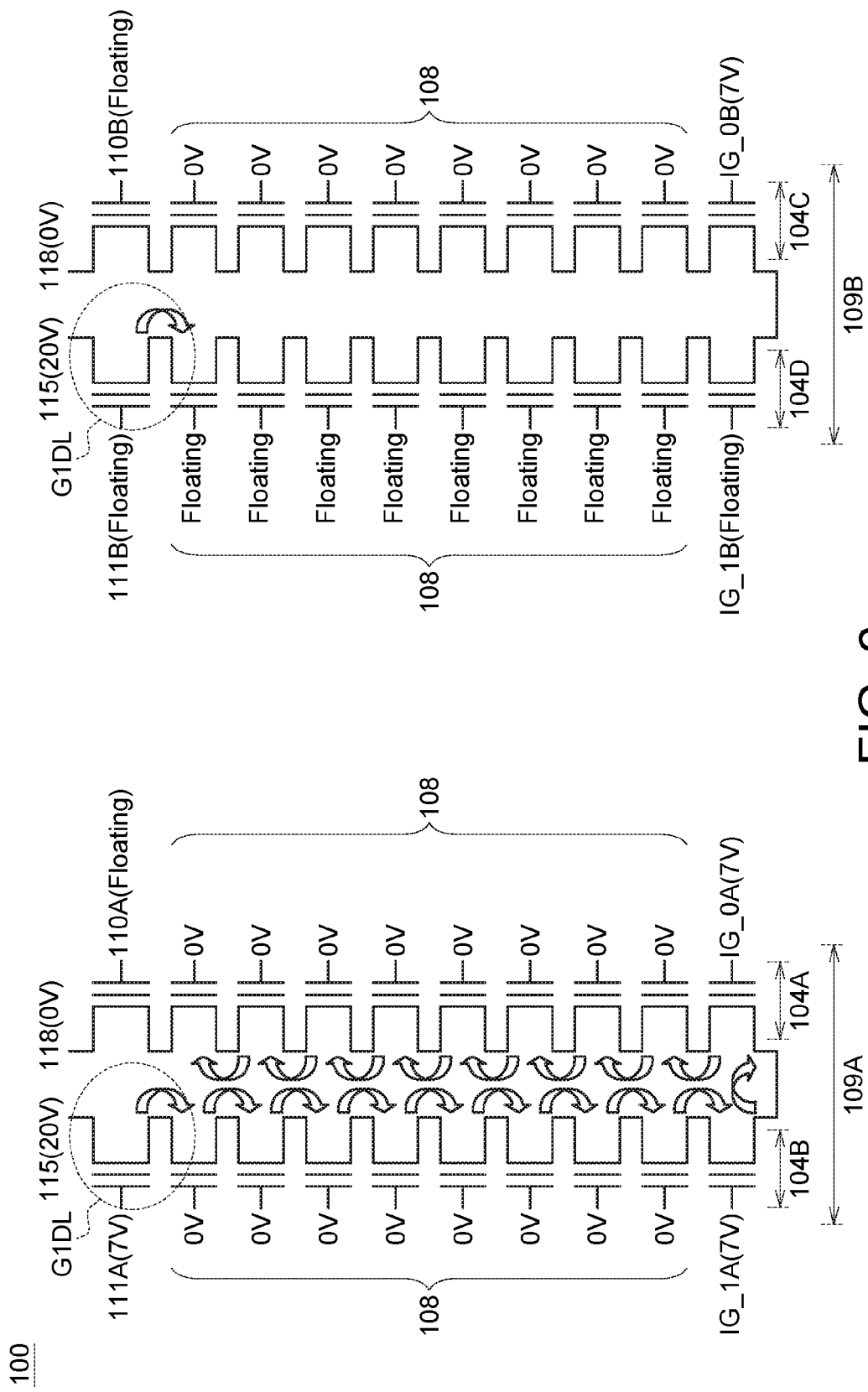
FIG. 6 is a diagram illustrating an equivalent circuit of the SGVC NAND device depicted in FIG. 1D as an erase operation is performed thereon.

FIG. 6 is a diagram illustrating an equivalent circuit of the SGVC NAND device 100 depicted in FIG. 1D when an erase operation is performed thereon. When first U-shaped memory cells strings 109A is selected to be subject to an erase operation, the first SSL switch 111A, the first control switch IG_1A and the first assist control switch IG_0A may be turn on by applying a voltage of 7 V on their gates; the first GSL switch 110A is turn off; a voltage of 0 V is then applied to the first GSL switch 110A through the common source line 118; a floating voltage is applied to the gate of the first GSL switch 110A; and the gates of the memory cell 108 formed in the first U-shaped memory cells strings 109A are subject to a voltage of 0V; the first SSL switch 111A is subject to an erase voltage of 20V trough the bit line 115. As a result, gated-induce drain leakage (GIDL) is induced at the memory cells 108 formed in the first U-shaped memory cells string 109A, and the data stored in the memory cell 108 can be erased.

Meanwhile, floating voltages are applied to the gates of the second SSL switch 111B formed on the ridge stack 104B, the memory cells 108 beneath the second SSL switch 111B, the second control switch IG_1B and the second GSL switch 110B in the unselected second U-shaped memory cells strings 109B. Since the conductive strips disposed in the ridge stacks 104A and 104C share the same word lines contact 110C and the first GSL switch 110A and the second GSL switch 110B share the common GSL pad 122, thus the gate voltages applied on the second GSL switch 110B and the memory cells 108 beneath the second GSL switch 110B can be identical to that applied on the first GSL switch 110A and the memory cells 108 beneath the first GSL switch 110A. The floated second SSL switch 111B, the memory cells 108 beneath the second SSL switch 111B and the second control switch IG_1B formed in the unselected second U-shaped memory cells strings 109B can delay the erase time of the unselected memory cells 108 formed in the unselected second U-shaped memory cells strings 109B, so as to avoid the unselected memory cells 108 from being erased.

In accordance with the aforementioned embodiments of the present disclosure, a 3D memory device having a plurality of ridge stacks is provided, wherein each of the ridge stacks either includes a SSL switch and a plurality of memory cells beneath the SSL switch or includes a GSL switch and a plurality of memory cells beneath the GSL switch. A first U-shaped memory cells string is formed by connecting a first SSL switch and a first GSL switch respectively disposed on two different ridge stacks, as well as the memory cells beneath the first SSL switch and the first GSL switch in series; and a second U-shaped memory cells string is formed by connecting a second SSL switch and a second GSL switch respectively disposed on another two ridge stacks, as well as the memory cells disposed beneath the second SSL and the second GSL switch.

The memory cells that are disposed beneath the first SSL switch in the first U-shaped memory cells string are connected to a first word lines contact; the memory cells that are disposed beneath the second SSL switch in the second U-shaped memory cells string are connected to a second word lines contact; and the memory cells that are disposed beneath the first GSL switch in the first U-shaped memory cells string and the second GSL switch in the second U-shaped memory cells are both connected to a third word lines contact. In other words, the number of the word lines contacts that is used to connect to the memory cells beneath the GSL switches is less than the number of the word lines contacts connected to the memory cells beneath the SSL switches. In comparison with the prior art 3D memory device, the total number of the word lines contacts can be reduced, if the memory densities thereof are not varied.

Therefore, the size of the 3D memory device can be reduced by reducing the number of the word lines contacts.

In addition, the memory densities can be increased without deteriorate the process window and the yield for fabricating the 3D memory device. As well the production cost thereof can be reduced significantly.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3 dimensional (3D) memory device, comprising:
    a multi-layer stacks structure, comprising a plurality of conductive strips insulated with each other and a plurality of trenches used to at least divide the multi-layer stacks structure into a first ridge stack, a second ridge stack, a third ridge stack and a fourth ridge stack;
    a first string select line (SSL) switch, disposed on the first ridge stack;
    a first ground select line (GSL) switch, disposed on the second ridge stack;
    a first U-shaped memory cells string, connecting the first SSL switch with the first GSL switch in series;
    a second SSL switch, disposed on the third ridge stack;
    a second GSL switch, disposed on the fourth ridge stack,
    a second U-shaped memory cells string, connecting the second SSL switch with the second GSL switch in series;
    a first word lines contact, in contact with a portion of the conductive strips disposed in the first ridge stack;
    a second word lines contact, in contact with a portion of the conductive strips disposed in the third ridge stack;
    a third word lines contact, in contact with a portion of the conductive strips disposed in the second ridge stack and the fourth ridge stack;
    a memory material layer, having a charge trapping structure and covering on sidewalls of the ridge stacks and the bottoms of the trenches;
    a patterned semiconductor channel layer, formed on the memory material layer, so as to form a plurality of memory cells at the cross points of the memory material layer, the patterned semiconductor channel layer and the conductor strips;
    a first control switch, disposed between the first SSL switch and the first GSL switch; and
    a second control switch, disposed between the second SSL switch and the second GSL switch;
    wherein when the first U-shaped memory cells string is selected to subject to a program operation, the program operation comprises:
    turning on the first SSL switch and the first control switch;
    turning off the first GSL switch, the second GSL switch and the second control switch;
    applying a program voltage (Vpgm) to one of the memory cells disposed on the first U-shaped memory cells string; and
    applying a pass-gate voltage (Vpass) to the other memory cells disposed on the first U-shaped memory cells string, wherein the Vpgm is greater than the Vpass.

2. The 3D memory device according to claim 1, further comprising:
    a first SSL pad, in contact with a top conductive strip disposed on the first ridge stack;
    a second SSL pad, in contact with a top conductive strip disposed on the third ridge stack; and a common GSL pad, in contact with two top conductive strips disposed on the second ridge stack and the fourth ridge stack.

3. The 3D memory device according to claim 1, wherein the first SSL switch, the memory cells formed on the first ridge stack and the second ridge stack and first GSL switch are connected in series to form the first U-shaped memory cells string; and the second SSL switch, the memory cells formed on the third ridge stack and the fourth ridge stack and second GSL switch are connected in series to form the second U-shaped memory cells string.

4. The 3D memory device according to claim 1, wherein the first control switch is connected to a bottom conductive strip of the first ridge stack; and the second control switch is connected to a bottom conductive strip of the third ridge stack.

5. The 3D memory device according to claim 4, further comprising:

a first assist control switch, disposed between the first control switch and the first GSL switch; and a second assist control switch, disposed between the second control switch and the second GSL switch.

6. The 3D memory device according to claim 5, wherein the first assist control switch is connected to a bottom conductive strip of the second ridge stack; and the second assist control switch is connected to a bottom conductive strip of the fourth ridge stack.

7. The 3D memory device according to claim 1, wherein a gate of the second SSL switch is floated during the program operation.

8. The 3D memory device according to claim 1, wherein when the first U-shaped memory cells string is selected to subject to a read operation, the read operation comprises:

turning on the first SSL switch, the first GSL switch, the second switch and the first control switch;

turning off the second control switch;

applying a read voltage (Vref) to one of the memory cells disposed on the first U-shaped memory cells string; and applying a pass-gate voltage (Vpass) to the other memory cells disposed on the first U-shaped memory cells string.

9. The 3D memory device according to claim 8, wherein a gate of the second SSL switch is floated during the read operation.

10. The 3D memory device according to claim 1, wherein when the first U-shaped memory cells string is selected to subject to an erase operation, the erase operation comprises:

turning on the first SSL switch, and the first control switch;

keeping a gate of the first GSL switch floated;

applying a voltage of 0V to plural gates of the memory cells disposed on the first U-shaped memory cells string; and applying an erase voltage to the first SSL switch, so as to induce gated-induce drain leakage (GIDL) at the memory cells disposed on the first U-shaped memory cells string.

11. The 3D memory device according to claim 10, wherein plural gates of the second SSL switch are floated, the second GSL switch and the second control switch during the erase operation.

12. The 3D memory device according to claim 1, wherein the first word lines contact, the second word lines contact and the third word lines contact comprise a staircase-shaped structure.

13. The 3D memory device according to claim 12, wherein the third word lines contact shapes as a long staircase.

* * * * *